(12) United States Patent
Jangjian et al.

(10) Patent No.: US 9,478,660 B2
(45) Date of Patent: Oct. 25, 2016

(54) PROTECTION LAYER ON FIN OF FIN FIELD EFFECT TRANSISTOR (FINFET) DEVICE STRUCTURE

(71) Applicant: TAIWAN SEMICONDUCTOR MANUFACTURING CO., LTD, Hsin-Chu (TW)

(72) Inventors: Shiu-Ko Jangjian, Tainan (TW); Chi-Cherng Jeng, Tainan (TW); Chih-Nan Wu, Tainan (TW); Chun-Che Lin, Tainan (TW); Ting-Chun Wang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/677,405

(22) Filed: Apr. 2, 2015

(65) Prior Publication Data

US 2016/0204245 A1    Jul. 14, 2016

Related U.S. Application Data

(60) Provisional application No. 62/102,414, filed on Jan. 12, 2015.

(51) Int. Cl.
*H01L 29/00* (2006.01)
*H01L 29/78* (2006.01)
*H01L 29/06* (2006.01)
*H01L 29/66* (2006.01)

(52) U.S. Cl.
CPC ......... *H01L 29/785* (2013.01); *H01L 29/0649* (2013.01); *H01L 29/66795* (2013.01)

(58) Field of Classification Search
CPC ........... H01L 29/785; H01L 29/66795; H01L 29/0649
See application file for complete search history.

(56) References Cited

U.S. PATENT DOCUMENTS

| 7,667,271 | B2 * | 2/2010 | Yu ..................... H01L 21/26586 257/347 |
| 8,106,459 | B2 * | 1/2012 | Chang ............... H01L 21/82341 257/328 |
| 8,420,464 | B2 * | 4/2013 | Basker .............. H01L 21/82382 257/E21.431 |
| 9,093,304 | B2 | 7/2015 | Koldiaev et al. |
| 2005/0093074 | A1 | 5/2005 | Anderson et al. |
| 2014/0203326 | A1 | 7/2014 | Mukherjee et al. |
| 2014/0306297 | A1 | 10/2014 | Ching et al. |

FOREIGN PATENT DOCUMENTS

| CN | 102157554 A | 8/2011 |
| DE | 11 2011 106 054 T5 | 9/2014 |

* cited by examiner

*Primary Examiner* — Nikolay Yushin
(74) *Attorney, Agent, or Firm* — Birch, Stewart, Kolasch & Birch, LLP

(57) ABSTRACT

A fin field device structure and method for forming the same are provided. The FinFET device structure includes a substrate and a fin structure extending from the substrate. The FinFET device structure also includes an isolation structure formed on the substrate. The fin structure has a top portion and a bottom portion, and the bottom portion is embedded in the isolation structure. The FinFET device structure further includes a protection layer formed on the top portion of the fin structure. An interface is between the protection layer and the top portion of the fin structure, and the interface has a roughness in a range from about 0.1 nm to about 2.0 nm.

18 Claims, 18 Drawing Sheets

PROTECTION LAYER ON FIN OF FIN FIELD EFFECT TRANSISTOR (FINFET) DEVICE STRUCTURE

CROSS REFERENCE TO RELATED APPLICATIONS

This application claims the benefit of U.S. Provisional Application No. 62/102,414, filed on Jan. 12, 2015, and entitled "PROTECTION LAYER ON FIN OF FIN FIELD EFFECT TRANSISTOR (FINFET) DEVICE STRUCTURE", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFET devices and methods of fabricating FinFET devices have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
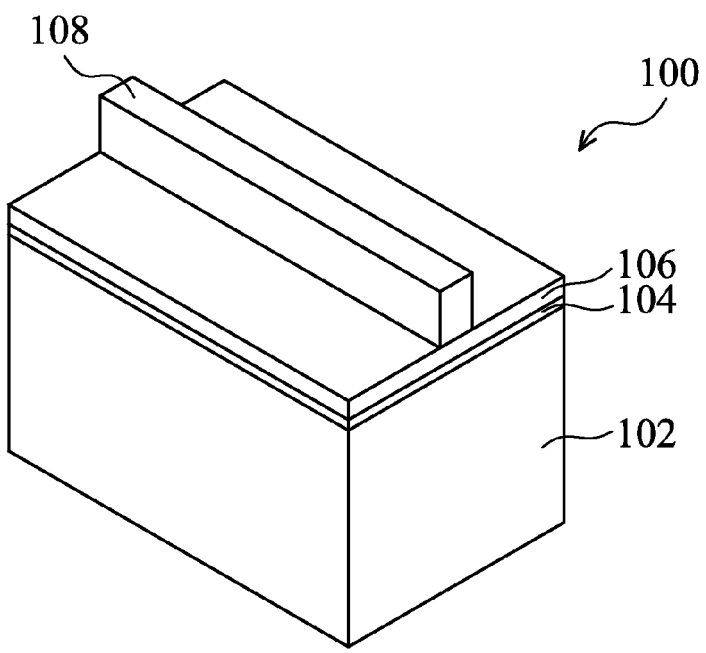
FIGS. 1A-1Q show cross-sectional representations of forming a fin field effect transistor (FinFET) device structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a fin field effect transistor (FinFET) device structure are provided. FIG. 1A-1O show cross-sectional representations of forming a fin field effect transistor (FinFET) device structure 100, in accordance with some embodiments of the disclosure.

The FinFET device structure 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer 104 and a hard mask layer 106 are formed on the substrate 102, and a photoresist layer 108 is formed on the hard mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process The dielectric layer 104 is a buffer layer between the substrate 102 and the hard mask layer 106. In addition, the dielectric layer 104 is used as a stop layer when the hard mask layer 106 is removed. The dielectric layer 104 may be made of silicon oxide. The hard mask layer 106 may be made of silicon oxide, silicon nitride, silicon oxynitride, or another applicable material. In some other embodiments, more than one hard mask layer 106 is formed on the dielectric layer 104.

The dielectric layer 104 and the hard mask layer 106 are formed by deposition processes, such as a chemical vapor deposition (CVD) process, high-density plasma chemical vapor deposition (HDPCVD) process, spin-on process, sputtering process, or another applicable process.

Figure 1B:
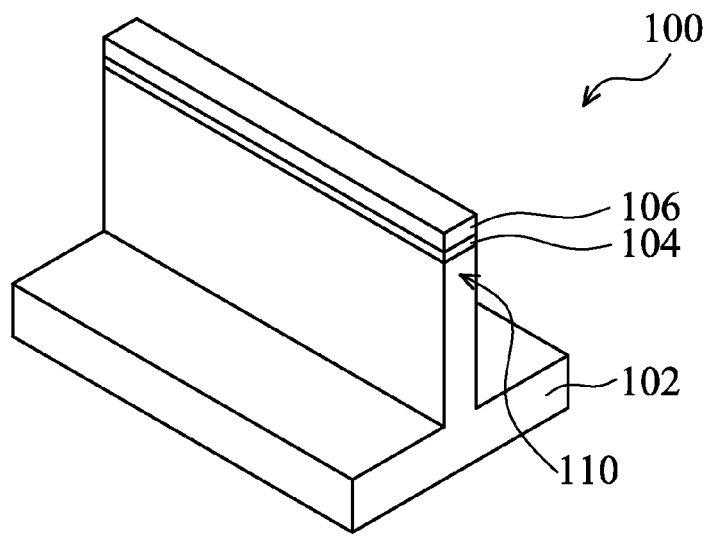
FIG. 1G' show a cross-sectional representation of a modification of FIG. 1G, in accordance with some embodiments of the disclosure.

After the photoresist layer 108 is patterned, the dielectric layer 104 and the hard mask layer 106 are patterned by using the patterned photoresist layer 108 as a mask as shown in FIG. 1B, in accordance with some embodiments. As a result, a patterned dielectric layer 104 and a patterned hard mask layer 106 are obtained. Afterwards, the patterned photoresist layer 108 is removed.

Afterwards, an etching process is performed on the substrate 102 to form a fin structure 110 by using the patterned dielectric layer 104 and the patterned hard mask layer 106 as a mask. The etching process may be a dry etching process or a wet etching process. In some embodiments, the substrate 102 is etched by a dry etching process. The dry etching process includes using the fluorine-based etchant gas, such as $SF_6$, $C_xF_y$, $NF_3$ or combinations thereof. The etching process may be a time-controlled process, and continue until the fin structure 110 reaches a predetermined height.

It should be noted that the number of fin structures 110 may be adjusted according to actual application, and it is not limited to one fin structure 110. In some other embodiments, the fin structure 110 has a width that gradually increases from the top portion to the lower portion.

Figure 1C:
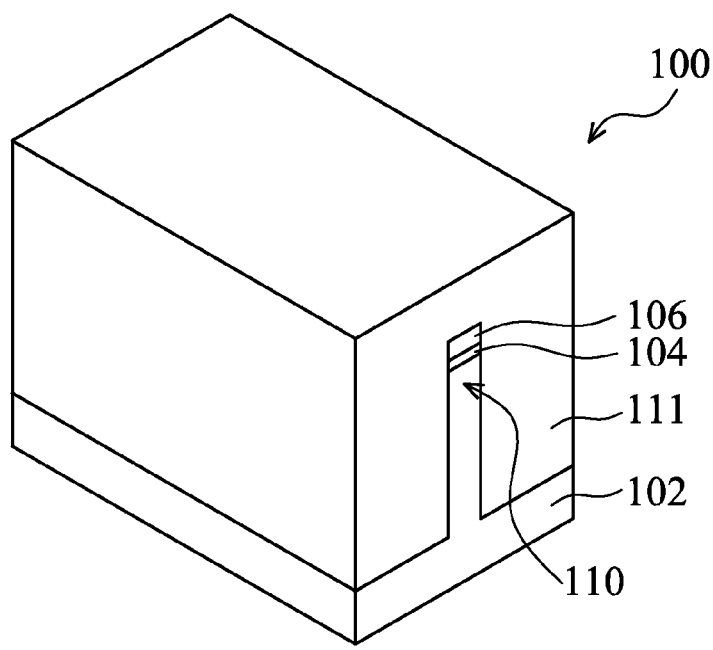

Afterwards, a dielectric material 111 is formed on the fin structure 110 as shown in FIG. 1C, in accordance with some embodiments. In some embodiments, the dielectric material 111 is made of silicon oxide, silicon nitride, silicon oxynitride, fluoride-doped silicate glass (FSG), or another low-k dielectric material. The dielectric material 111 may be deposited by a chemical vapor deposition (CVD) process, a spin-on-glass process, or another applicable process.

Figure 1D:
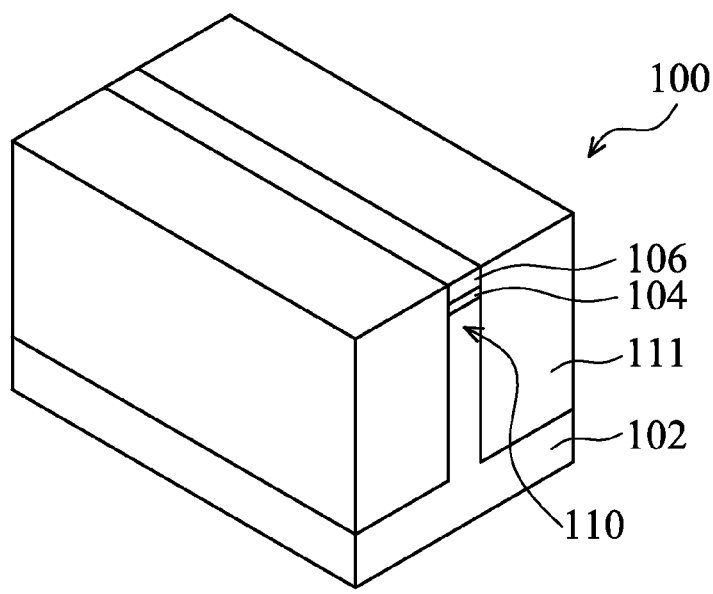

Afterwards, the dielectric material 111 is thinned or planarized to expose the top surface of the hard mask layer 106 as shown in FIG. 1D, in accordance with some embodiments. As a result, the top surface of the dielectric material 111 is level with the top surface of the hard mask layer 106. In some embodiments, the dielectric material 111 is thinned by a chemical mechanical polishing (CMP) process.

Figure 1E:
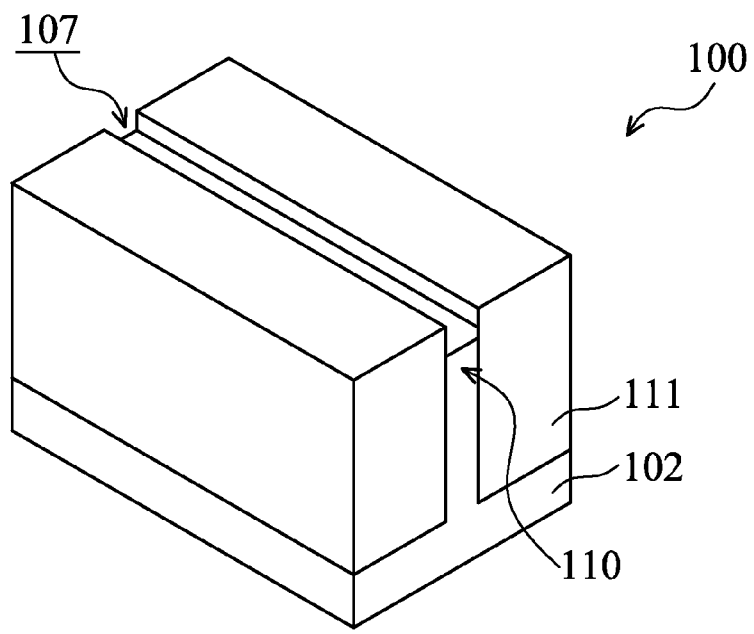

After the dielectric material 111 is thinned, the hard mask layer 106 and the dielectric layer 104 are removed to form a recess 107 as shown in FIG. 1E, in accordance with some embodiments. The hard mask layer 106 and the dielectric layer 104 are respectively removed by an etching process, such as a dry etching process or a wet etching process.

Figure 1F:
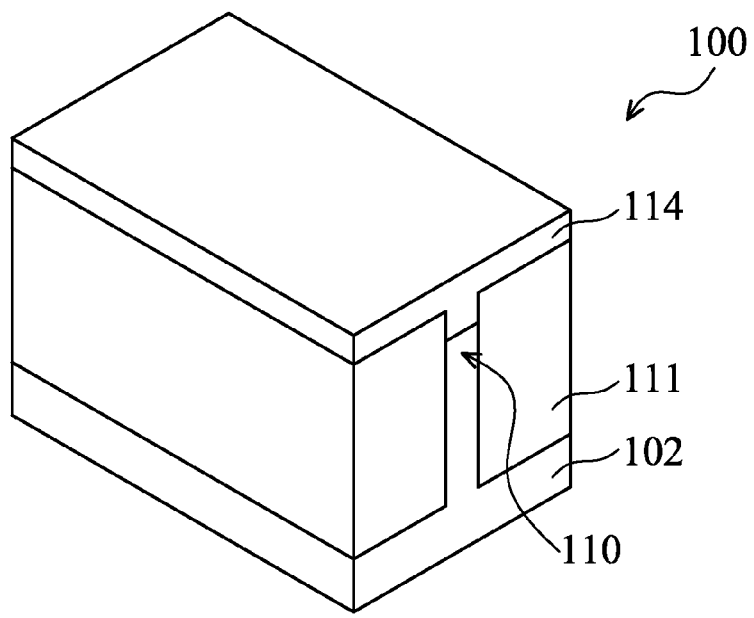

After the recess 107 is formed, a sacrificial layer 114 is formed in the recess 107 and on the dielectric material 111 as shown in FIG. 1F, in accordance with some embodiments. The sacrificial layer 114 is used to protect the top surface of the fin structure 110. The sacrificial layer 114 may have a single layer or multiple layers. The sacrificial layer 114 is made of silicon oxide, silicon nitride, silicon oxynitride or combinations thereof.

Figure 1G:
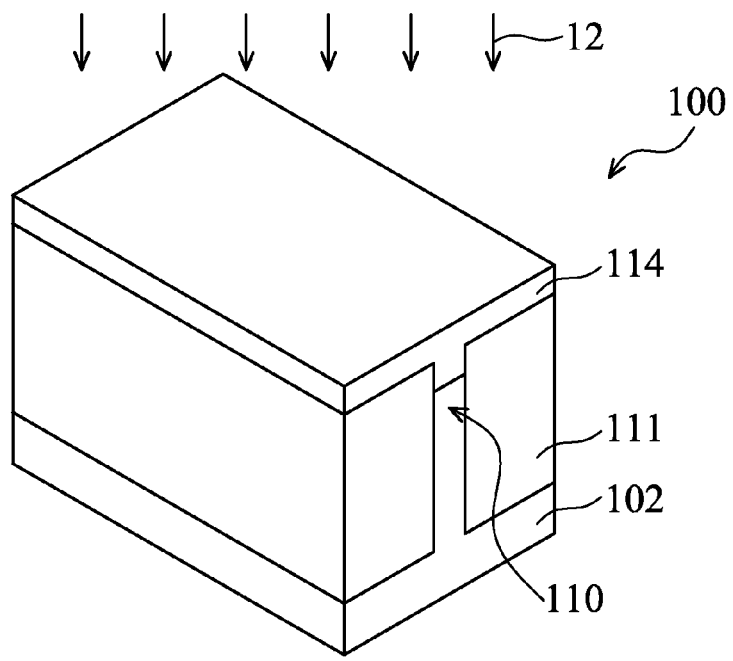
Figure 1G:
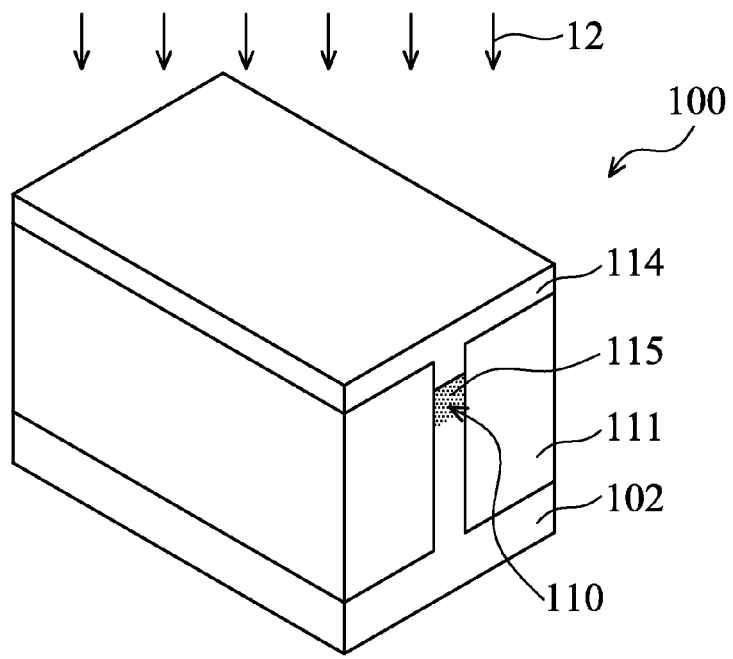

After the sacrificial layer 114 is formed, an ion implant process 12 is optionally performed on the top surface of the fin structure 110 as shown in FIG. 1G, in accordance with some embodiments. The ion implant process 12 is configured to dope the channel region with dopants, and the channel region is formed below a gate structure (formed later). As a result, as shown in FIG. 1G', a doped region 115 in the fin structure 110 is obtained. In some embodiments, doped regions 115 are doped with an n-type dopant, such as arsenic (As), phosphorous (P) or antimony (Sb). In some other embodiments, doped regions 115 are doped with a p-type dopant, such as boron (B) or boron fluorine ($BF_2$).

Figure 1H:
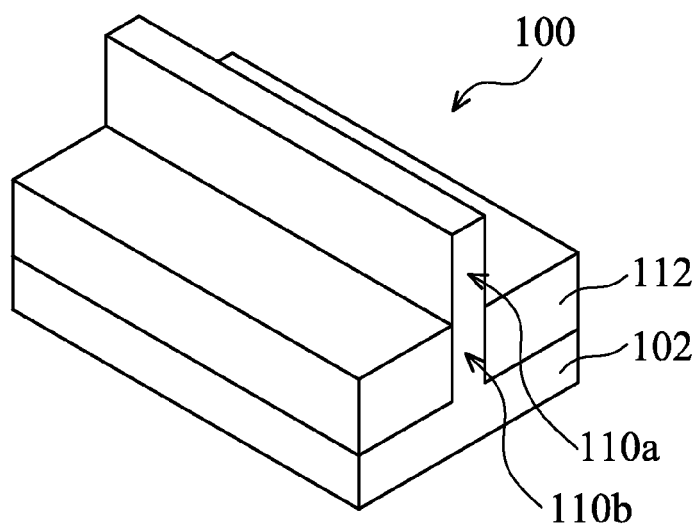

After the doped region is formed, the sacrificial layer 114 is removed as shown in FIG. 1H, in accordance with some embodiments. Afterwards, a top portion of the dielectric material 111 is removed to form an isolation structure 112. In some embodiments, the sacrificial layer 114 is removed by an etching process. In some embodiments, the top portion of the dielectric material 111 is removed by an etching process. The remaining isolation structure 112 is seen as a shallow trench isolation (STI) structure. The fin structure has a top portion 110a and a bottom portion 110b. The bottom portion 110b is embedded in the isolation structure 112. The top portion 110a is exposed.

Figure 1I:
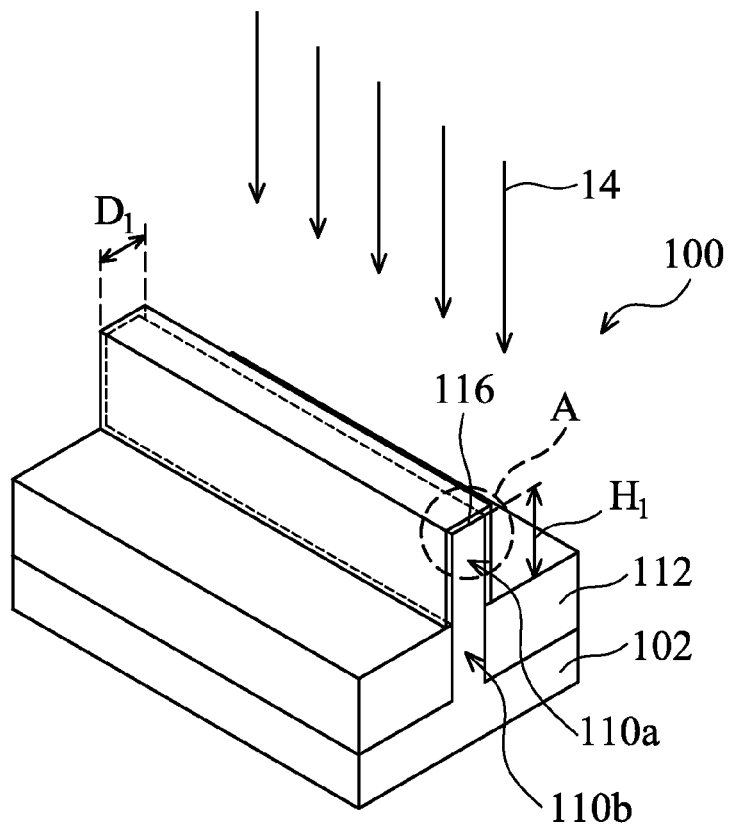

Afterwards, a protection layer 116 is conformally formed on the top portion 110a of the fin structure 110 as shown in FIG. 1I, in accordance with some embodiments. The protection layer 116 is formed by a deposition process 14. The protection layer 116 is used to protect the fin structure 110 from being damaged in the subsequent processes. In addition, the protection layer 116 is used to repair the defects and/or the dangling bonds in the fin structure 110. The term "dangling bond" refers to a broken covalent bond. The dangling bonds are very unstable.

Before the protection layer 116 is formed on the fin structure 110, the fin structure 110 may be damaged by the above-mentioned process, which may be a dry etching process, a wet etching process, or a polishing process. Therefore, the surface of the fin structure 110 may have some defects and/or dangling bonds. In some embodiments, the defects or dangling bonds may capture electrons, and therefore the mobility of the electrons may be reduced. In some embodiments, the unwanted electrons are released from the dangling bonds, and therefore unwanted leakage current is produced. In order to improve the performance of the FinFET device structure 100, the protection layer 116 is formed to repair the defects and/or dangling bonds in the fin structure 110.

An interface is formed between the protection layer 116 and the top portion 110a of the fin structure 110. It should be noted that the electrons of the FinFET device structure 100 is transported along the interface. If the roughness of the interface is too great, the electrons may be captured by the rough surface. In order to improve the mobility of the electrons, the roughness of the interface should be small. In some embodiments, the interface between the protection layer 116 and the top portion 110a of the fin structure 110 has a roughness in a range from about 0.1 nm to about 2.0 nm. The roughness is measured by a high-resolution Transmission Electron Microscopy (TEM). If the roughness is too large, the electrons may be trapped by the rough surface, and therefore the mobility of the device is decreased.

When the roughness is in above-mentioned range, the mobility of the electrons is increased and the performance of the FinFET device structure 100 is improved.

The protection layer 116 is made of silicon-containing compound, such as silicon oxide (SiOx), silicon oxynitride (SiOxNy) or silicon oxycarbide (SiOC). As mentioned above, the protection layer 116 is formed by a deposition process 14. In some embodiments, the protection layer 116 is formed by a microwave plasma process, a thermal oxidation process, a plasma-enhanced chemical vapor deposition process (PECVD) process, or atomic layer deposition (ALD) process.

In some embodiments, the thermal oxidation process is used to form the protection layer 116. In some embodiments, the thermal oxidation process is performed at a temperature in a range from about 700 degrees to about 100 degrees.

In some embodiments, the atomic layer deposition (ALD) process is used to form the protection layer 116. In some embodiments, the ALD process is performed at a temperature in a range from about 200 degrees to about 900 degrees.

In some embodiments, the plasma-enhanced chemical vapor deposition (PECVD) process is used to form the protection layer 116. In some embodiments, the PECVD process is performed at a temperature in a range from about 200 degrees to about 500 degrees. Compared with the ALD process and the thermal oxidation process, the PECVD process is operated at a relatively low temperature.

In some embodiments, the microwave plasma process is used, and the "plasma" in the microwave plasma process has a gaslike state of matter consisting of positively or negatively charged ions, free electrons, and neutral particles. The microwave plasma process is performed by using oxygen gas ($O_2$), hydrogen ($H_2$) gas or another applicable gas. The another applicable gas may be nitrogen ($N_2$) gas, argon (Ar) gas, helium (He) gas, krypton (Kr) gas, xenon (Xe) gas or combinations thereof. In some other embodiments, the oxygen-containing gas, such as water vapor ($H_2O$), nitrous oxide (NO), nitrous oxide ($N_2O$) or combinations thereof, is used in the microwave plasma process.

In some embodiments, the microwave plasma process is performed under a pressure in a range from about 0.1 torr to about 10 torr. If the pressure is too high, the roughness of the interface between the top portion 110a of the fin structure 110 and the protection layer 116 may be too great. If the pressure is too low, the amount of excited ions is few. The excited ions tend to collide with the surface of the fin structure 110, rather than colliding with each other. Therefore, the top portion 110a of the fin structure 110 may be damaged when the pressure is too low. In addition, the growth rate of the protection layer 116 may be too slow when the pressure is too low.

In some embodiments, the microwave plasma process is performed at a temperature in a range from about 400 degrees to about 600 degrees. The operation temperature of the microwave plasma process is lower than that of the thermal oxidation process.

It should be noted that, while the microwave plasma process is being performed, a portion of the fin structure 110 is consumed and oxidized to form the oxide layer. More specifically, the original surface of the fin structure 110 is destroyed and rebuilt by the excited ions. The uneven surface of the fin structure 110 is removed and a new surface (or interface) is grown. In addition, the dangling bonds which exist at the end of the surface of the fin structure are repaired by supplying the hydrogen ($H_2$) gas.

If an oxide layer is formed by a radio-frequency (RF) plasma process, an oxide material may be directly deposited on the original surface of the fin structure 110. As a result, the interface between the oxide layer and the fin structure 110 may not be repaired and still have an uneven surface.

Figure 2:
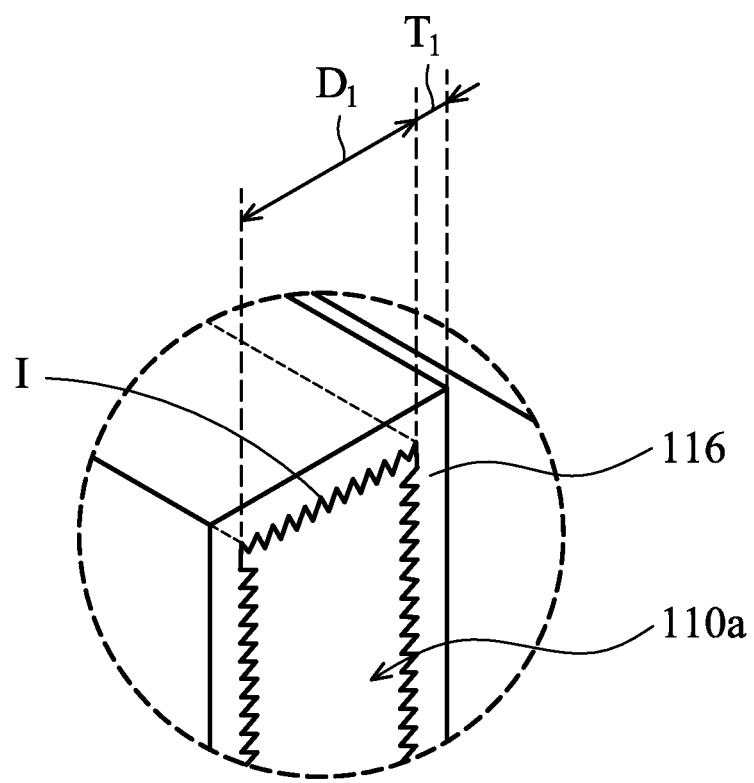
FIG. 2 shows an enlarged representation of a region A of FIG. 1I, in accordance with some embodiments.

FIG. 2 shows an enlarged representation of a region A of FIG. 1I, in accordance with some embodiments. As shown in FIG. 2, the protection layer 116 has a thickness $T_1$. In some embodiments, the thickness $T_1$ is in a range from about 1 angstrom (Å) to about 10 angstrom (Å). If the thickness is too great, a pitch P (shown in FIG. 6) between two adjacent fin structures 110 is reduced. Therefore, the critical dimension (CD) is reduced. If the thickness is too small, the protective effect may not good enough to prevent the fin structure 110 from being damaged by the subsequent processes.

As shown in FIG. 2, the fin structure 110 has a fin width $D_1$ and a fin height $H_1$ (shown in FIG. 1I). The fin height $H_1$ is defined by a distance from a bottom surface of the top portion 110a to a top surface of the top portion 110a. The bottom surface is substantially level with the top surface of the isolation structure 112. The top portion 110a and the bottom portion 110b are used to define the position of the protection layer 116, and there is no obvious interface between the top portion 110a and the bottom portion 110b. In some embodiments, the fin height $H_1$ is in a range from about 20 nm to about 60 nm. In some embodiments, the fin width $D_1$ is in a range from about 5 nm to about 20 nm.

Figure 1J:
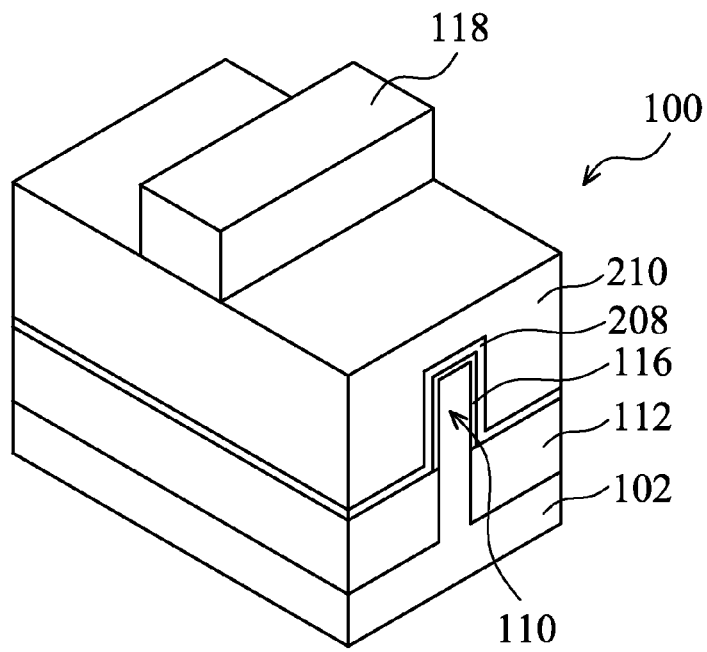
Figure 1K:
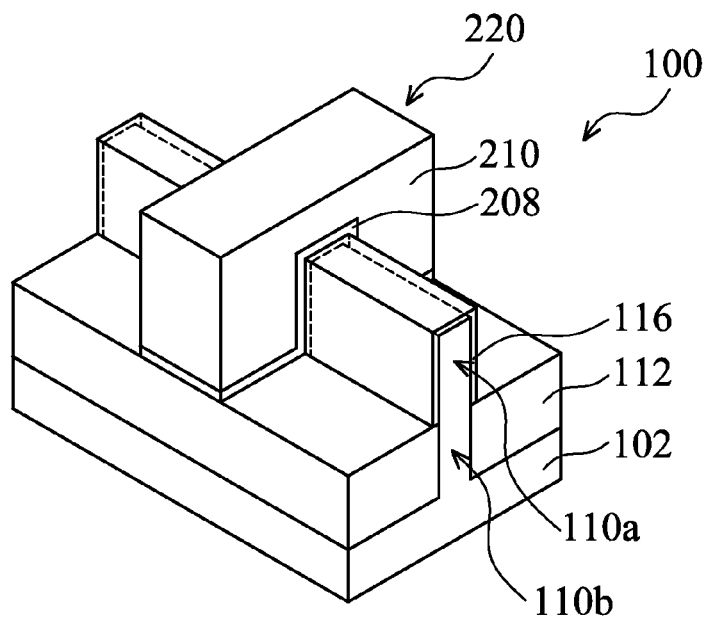

After the protection layer 116 is formed, a dummy gate dielectric layer 208 and a dummy gate electrode 210 are formed on the isolation structure 112 and the protection layer 116 as shown in FIG. 1J, in accordance with some embodiments. In some embodiments, the dummy gate dielectric layer 208 is made of dielectric materials, such as silicon oxide, silicon nitride, silicon oxynitride, dielectric material(s) with high dielectric constant (high-k), or combinations thereof. The dummy gate dielectric layer 208 is formed by a deposition process, such as chemical vapor deposition (CVD), physical vapor deposition (PVD), atomic layer deposition (ALD), high density plasma CVD (HDP-CVD), metal organic CVD (MOCVD), or plasma enhanced CVD (PECVD).

In some embodiments, the dummy gate electrode layer 210 is made of conductive or non-conductive materials. In some embodiments, the dummy gate electrode layer 210 is made of polysilicon. The dummy gate electrode layer 210 is formed by a deposition process, such as chemical vapor deposition (CVD), physical vapor deposition (PVD), atomic layer deposition (ALD), high density plasma CVD (HDP-CVD), metal organic CVD (MOCVD), or plasma enhanced CVD (PECVD).

After the dummy gate electrode layer 210 is formed, a hard mask layer 118 is formed and on the dummy gate electrode layer 210. The hard mask layer 118 is patterned to form a patterned hard mask layer 118. The patterned hard mask layer 118 is used for protecting the underlying layers from being etched during the subsequent processes.

After the patterned hard mask layer 118 is formed, a portion of the dummy gate dielectric layer 208 and the dummy gate electrode layer 210 are removed to form a dummy gate structure 220 as shown in FIG. 1H, in accordance with some embodiments. The dummy gate structure 220 includes the portions of the dummy gate dielectric layer 208 and the dummy gate electrode layer 210 positioned below the patterned hard mask layer 118. The top portion 110a of the fin structure 110 is covered by the protection layer 116. More specifically, the protection layer 116 is formed between the top portion 110a of the fin structure 110 and the dummy gate dielectric layer 208.

In the middle portion of the fin structure 110, the protection layer 116 is formed between the dummy gate structure 220 and the fin structure 110. The portions of the dummy gate dielectric layer 114 and the dummy gate electrode layer 116 are removed by an etching process, such as a wet etching process or a dry etching process.

Figure 1L:
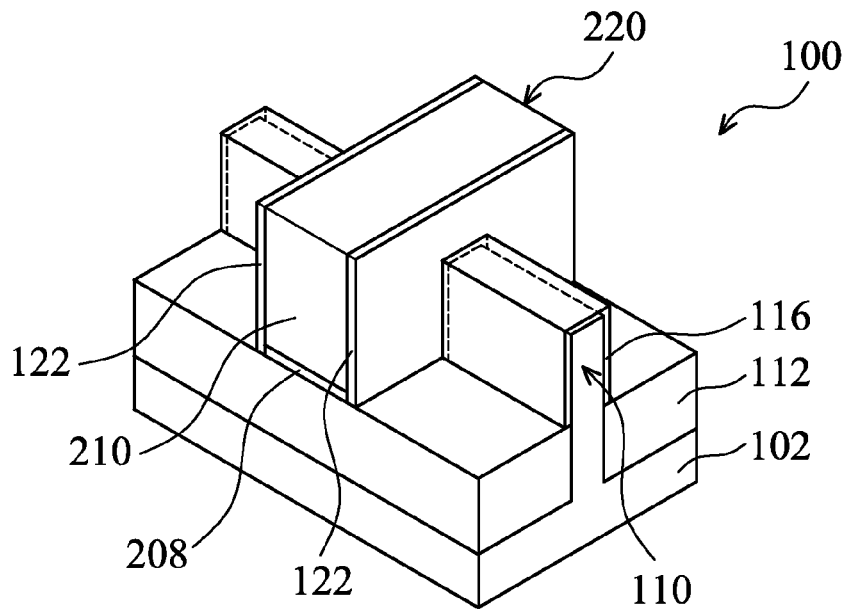

After the dummy gate structure 220 is formed, spacers 122 are formed on the opposite sidewalls of the dummy gate structure 120 as shown in FIG. 1L, in accordance with some embodiments. In some embodiments, spacers 122 are made of silicon nitride, silicon carbide, silicon oxynitride, silicon carbon, silicon oxide, silicon hydrogen, another applicable material, or a combination thereof. In some embodiments, a spacer material layer is deposited over the substrate 102 and the dummy gate structure 220. Afterwards, an anisotropic etching process is performed to partially remove the spacer material layer. As a result, the remaining portions of the spacer material layer form the spacers 122.

Figure 1M:
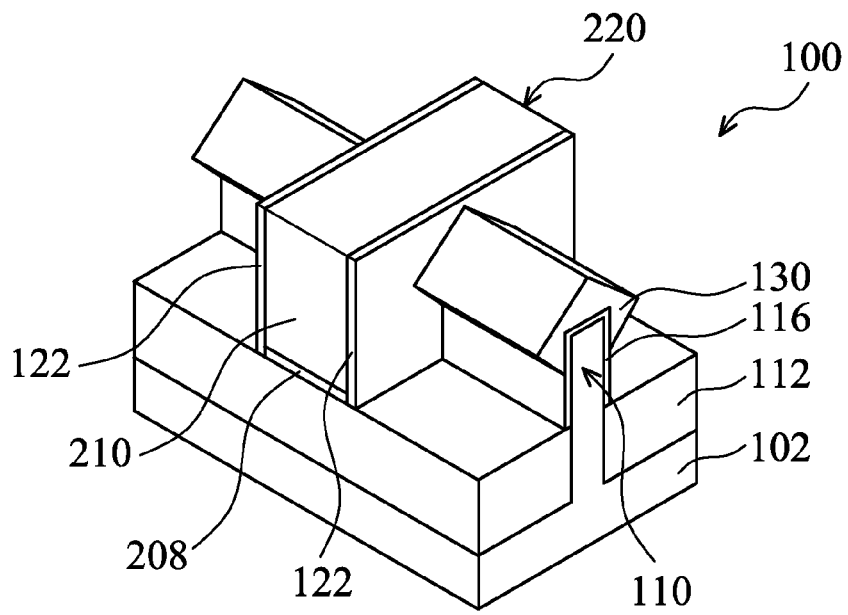

Afterwards, the source/drain (S/D) structures 130 are formed on the fin structure 110 as shown in FIG. 1M, in accordance with some embodiments. In some embodiments, the source/drain structures 130 are strained source/drain structures. In some embodiments, the source/drain structures 130 include silicon germanium (SiGe), germanium (Ge), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof.

In some embodiments, the source/drain (S/D) structures 130 are formed by growing a strained material on the fin structure 110 by an epitaxial (epi) process. In addition, the lattice constant of the strained material may be different from the lattice constant of the substrate 102. The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy, or other suitable epi processes.

It should be noted that the protection layer 116 is formed between the S/D structures 130 and the top portion 110a of the fin structure 110. The fin structure 110 is protected by the protection layer 116 from being damaged by the following processes. In addition, the interface which is formed between the top portion 110a of the fin structure 110 and the protection layer 116 has a roughness smaller than 2 nm. It should be noted that the electrons are transported along the interface. The mobility of electrons is improved by the smooth interface. Once the mobility of electrons is increased, the performance of the FinFET device structure is improved.

Figure 1N:
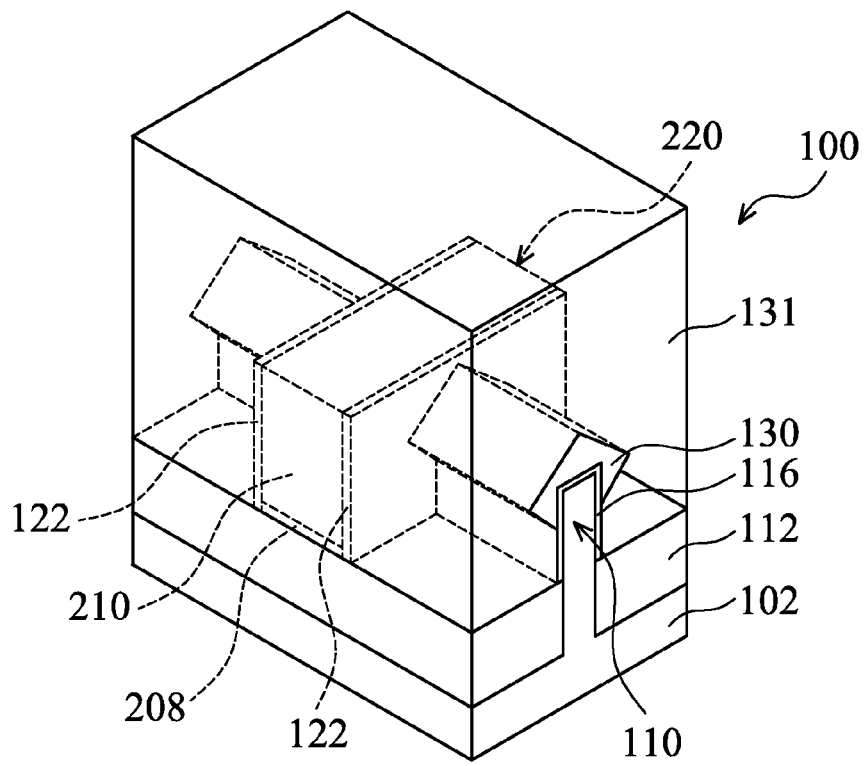
Figure 1O:
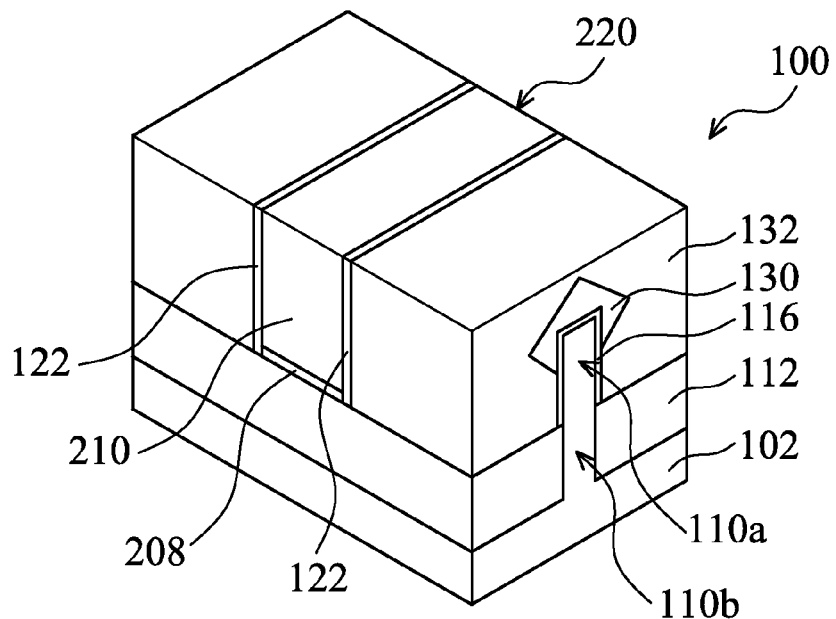

Afterwards, an inter-layer dielectric (ILD) material 131 is formed over the S/D structures 130 over the substrate 102 as shown in FIG. 1N, in accordance with some embodiments. In some embodiments, an inter-layer dielectric (ILD) material 131 is formed over the isolation structure 112 and the dummy gate structure 220.

The inter-layer dielectric (ILD) material may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The inter-layer dielectric (ILD) material may be formed by chemical vapor deposition (CVD), physical vapor deposition, (PVD), atomic layer deposition (ALD), spin-on coating, or other applicable processes.

It should be noted that a portion of the protection layer 116 is formed between the ILD structure 132 and the fin structure 110. In some embodiments, a contact etch stop layer (CESL) (not shown) is formed before the ILD material 131 is formed.

Afterwards, a polishing process is performed to the ILD material 131, as shown in FIG. 1O, in accordance with some embodiments. In some embodiments, the ILD material 131 is planarized by a chemical mechanical polishing (CMP) process until the top surface of dummy gate structure 220 is exposed. As a result, an ILD structure 132 is formed.

Figure 1P:
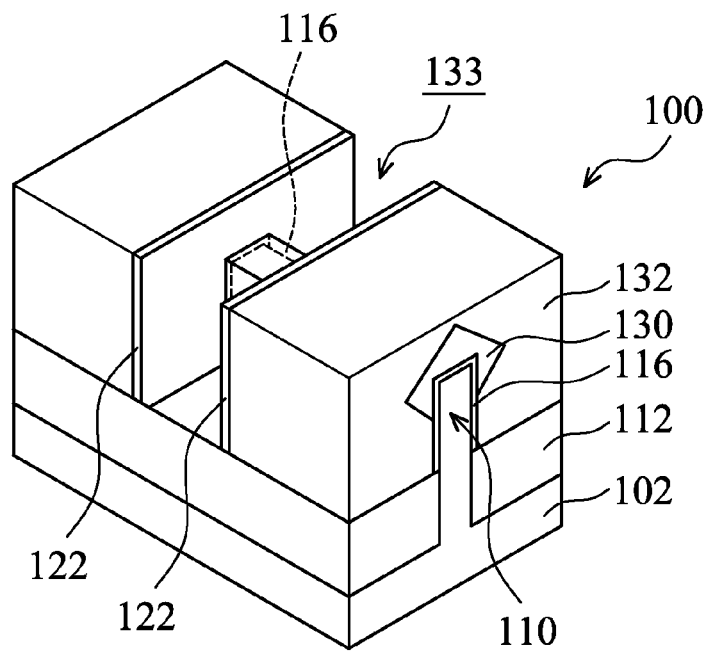

After the ILD structure 132 is formed, the dummy gate structure 220 is removed to form a trench 133 in the ILD structure 132 as shown in FIG. 1P, in accordance with some embodiments. The dummy gate structure 220 is removed by performing a first etching process and a second etching process. The dummy gate electrode layer 208 is removed by the first etching process, and the dummy gate dielectric layer 210 is removed by the second etching process. In some embodiments, the first etching process is a dry etching process and the second etching process is a wet etching process. In some embodiments, the dry etching process includes using an etching gas, such as $CF_4$, Ar, $NF_3$, $Cl_2$, He, HBr, $O_2$, $N_2$, $CH_3F$, $CH_4$, $CH_2F_2$, or a combination thereof.

It should be noted that the protection layer 116 is not removed when the dummy gate structure 220 is removed. The protection layer 116 is exposed when the trench 133 is formed.

Figure 1Q:
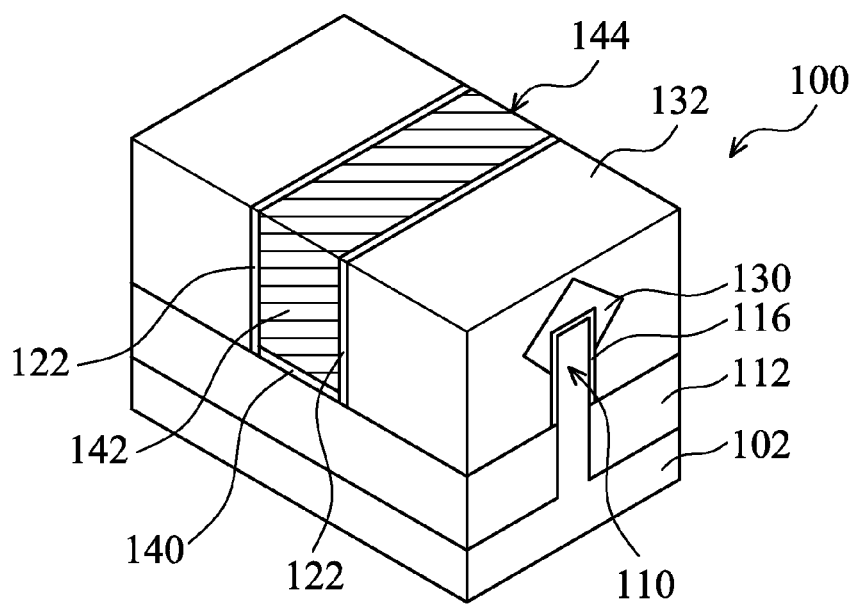

After the trench 133 is formed, a gate dielectric layer 140 and a gate electrode layer 142 are filled into the trench 133 as shown in FIG. 1Q, in accordance with some embodiments. Therefore, a gate structure 144 including the gate dielectric layer 140 and the gate electrode layer 142 is obtained.

In some embodiments, the gate dielectric layer 140 is made of a high-k dielectric material. The high-k dielectric material may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or the like.

In some embodiments, the gate electrode layer 142 is made of a metal material. The metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or combinations thereof. The P-work-function metal includes titanium nitride (TiN), tungsten nitride (WN), tantalum nitride (TaN), ruthenium (Ru) or combinations thereof.

As shown in FIG. 1Q, the gate structure 144 is transversely overlying a middle portion of the fin structure 110. A channel region is formed below the gate structure 144, and the channel region is wrapped by the gate structure 144. Since the protection layer 116 is exposed when the trench 133 is formed, the protection layer 116 is formed between the gate dielectric layer 140 and the fin structure 110. In other words, the gate dielectric layer 140 directly contacts with the protection layer 116, rather than the fin structure 110.

FIGS. 3A-3F show cross-sectional representations of forming a fin field effect transistor (FinFET) device structure, in accordance with some embodiments of the disclosure.

Figure 3A:
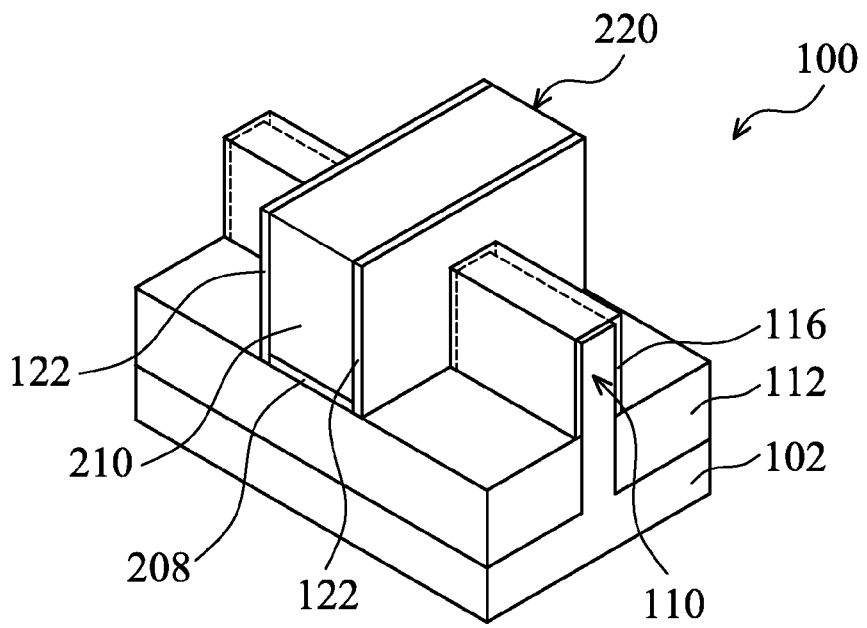
FIGS. 3A-3F show cross-sectional representations of forming a fin field effect transistor (FinFET) device structure, in accordance with some embodiments of the disclosure.

As shown in FIG. 3A, spacers 122 are formed on the opposite sidewalls of the dummy gate structure 120. The structure of FIG. 3A is similar to FIG. 1L.

Figure 3B:
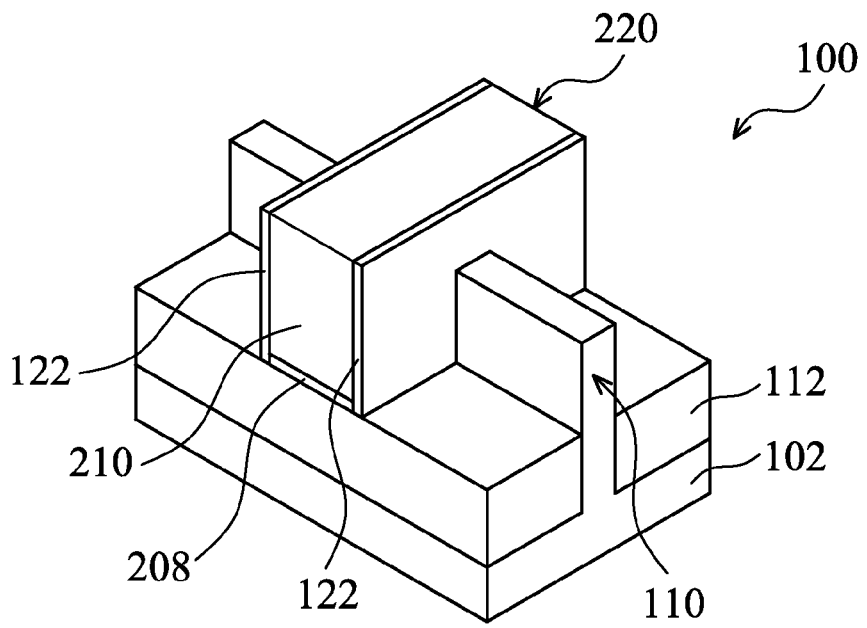

After forming the spacers 122, the exposed protection layer 116 formed on the top portion 110a of the fin structure 110 are removed by an etching process as shown in FIG. 3B, in accordance with some embodiments of the disclosure. It should be noted that a portion of the protection layer 116 covered by the dummy gate structure 220 is still formed on the top portion 110a of the fin structure 110.

Figure 3C:
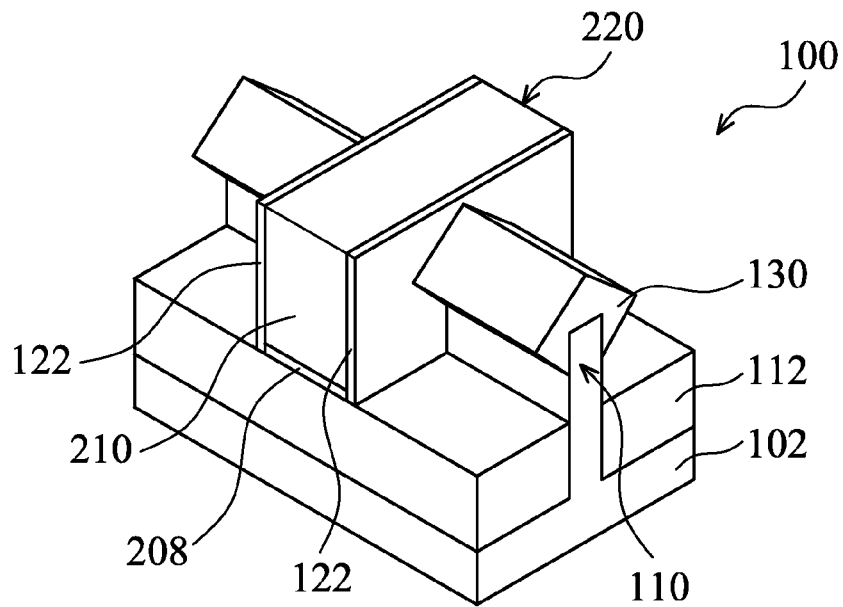

After the exposed protection layer 116 is removed, the source/drain (S/D) structures 130 are formed on the fin structure 110 as shown in FIG. 3C, in accordance with some embodiments.

After the S/D structures 130 are formed on the fin structure 110, the inter-layer dielectric (ILD) material (not shown) is formed over the S/D structures 130 over the substrate 102.

Figure 3D:
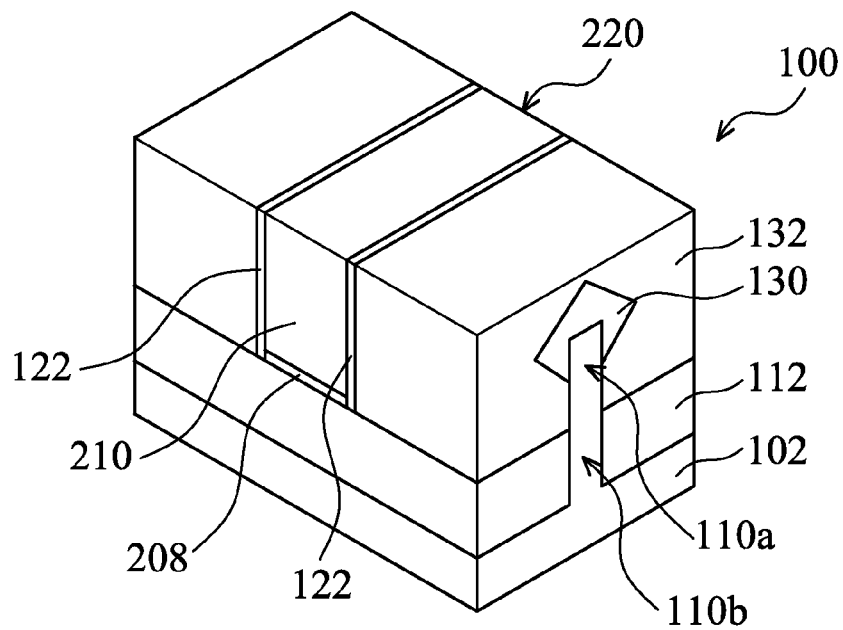

Afterwards, the ILD material is planarized until to expose a top surface of the dummy gate structure 220 as shown in FIG. 3D, in accordance with some embodiments. Therefore, the ILD structure 132 is formed.

Figure 3E:
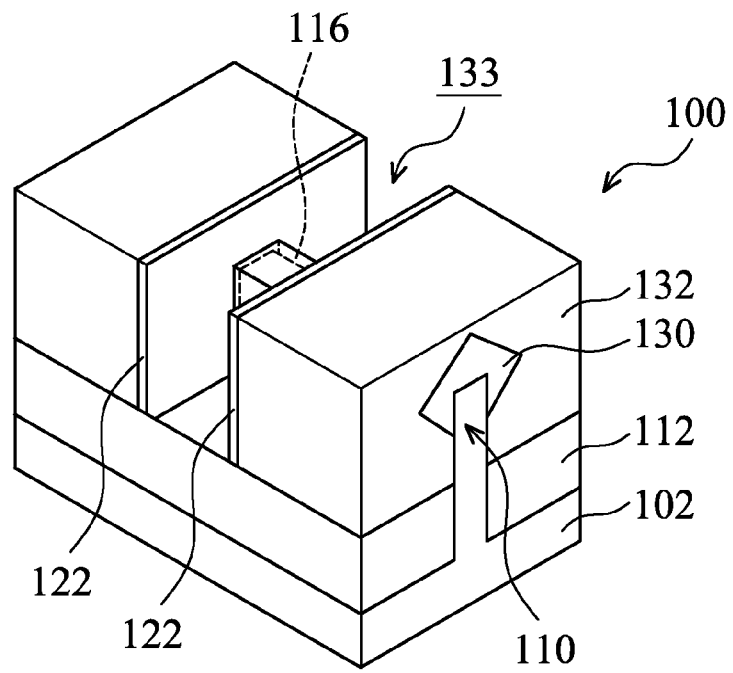

After the ILD structure 132 is formed, the dummy gate structure 220 is removed to form the trench 133 in the ILD structure 132 as shown in FIG. 3E, in accordance with some embodiments.

Figure 3F:
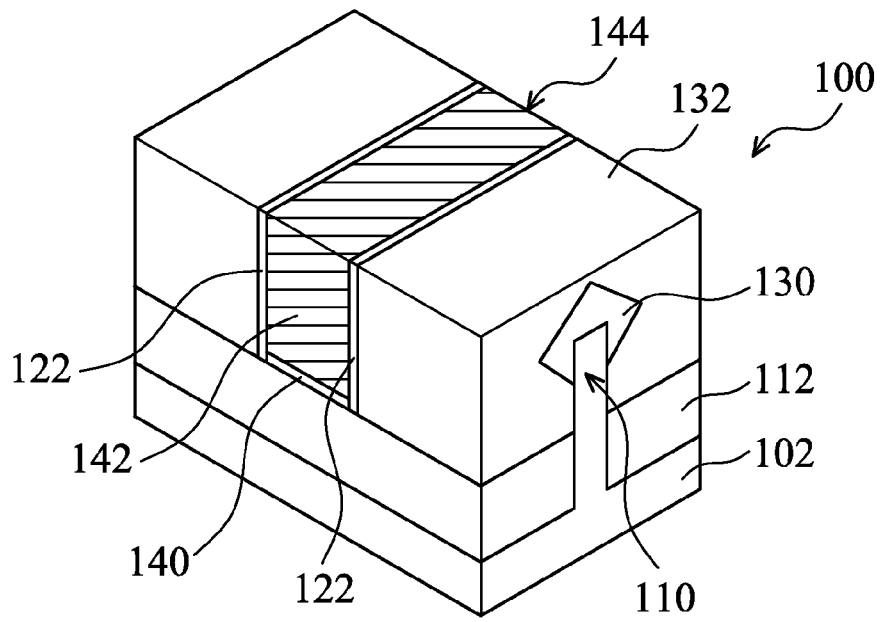

After the dummy gate structure 220 is removed, the gate dielectric layer 140 and the gate electrode layer 142 are filled into the trench 133 as shown in FIG. 3F, in accordance with some embodiments. Therefore, the gate structure 144 including the gate dielectric layer 140 and the gate electrode layer 142 is obtained.

Compared with FIG. 1Q and FIG. 3F, the protection layer 116 underlying the S/D structures 130 are still remained on the fin structure 110 in FIG. 1O, but it is removed in FIG. 3F. The advantage of FIG. 3F is that the S/D structures 130 are easier grown on the fin structure 110 than it grown on the protection layer 116.

It should be noted that the remaining protection layer 116 is formed between the middle portion of the fin structure 110 and the gate dielectric layer 140. The protection layer 116 is used to repair the defects and/or the dangling bonds in the top portion 110a of the fin structure 110. In addition, the channel portion below the gate dielectric layer 140 is wrapped by the protection layer 116.

FIGS. 4A-4F show cross-sectional representations of forming a fin field effect transistor (FinFET) device structure, in accordance with some embodiments of the disclosure.

Figure 4A:
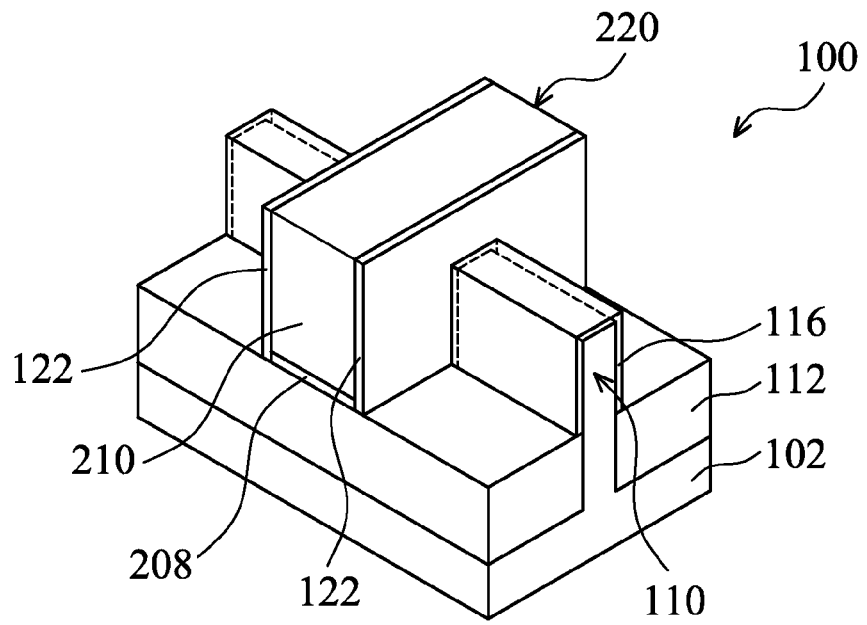
FIGS. 4A-4F show cross-sectional representations of forming a fin field effect transistor (FinFET) device structure, in accordance with some embodiments of the disclosure.
Figure 4B:
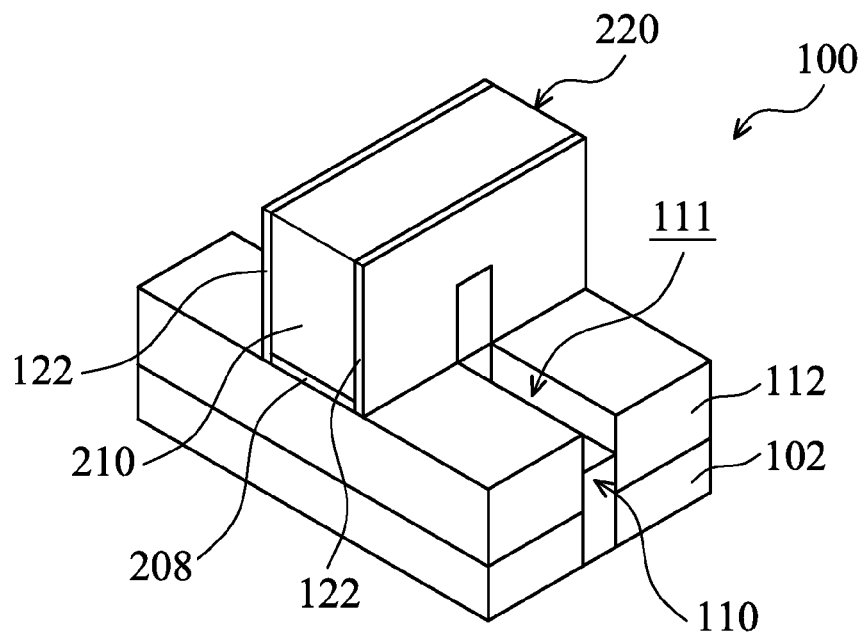

As shown in FIG. 4A, spacers 122 are formed on the opposite sidewalls of the dummy gate structure 120.

After the spacers 122 are formed, the exposed protection layer which is not covered by the dummy gate structure 220 and a portion of the fin structure 110 are removed to form a recess 111. The recess 111 is formed by using an etching process. The top surface of the recess 111 is lower than the top surface of the isolation structure 112. The recess 111 has a bottom surface and sidewalls. The bottom surface of the recess 111 is the fin structure 110, and the sidewalls of the recess 111 are the isolation structure 112.

Figure 4C:
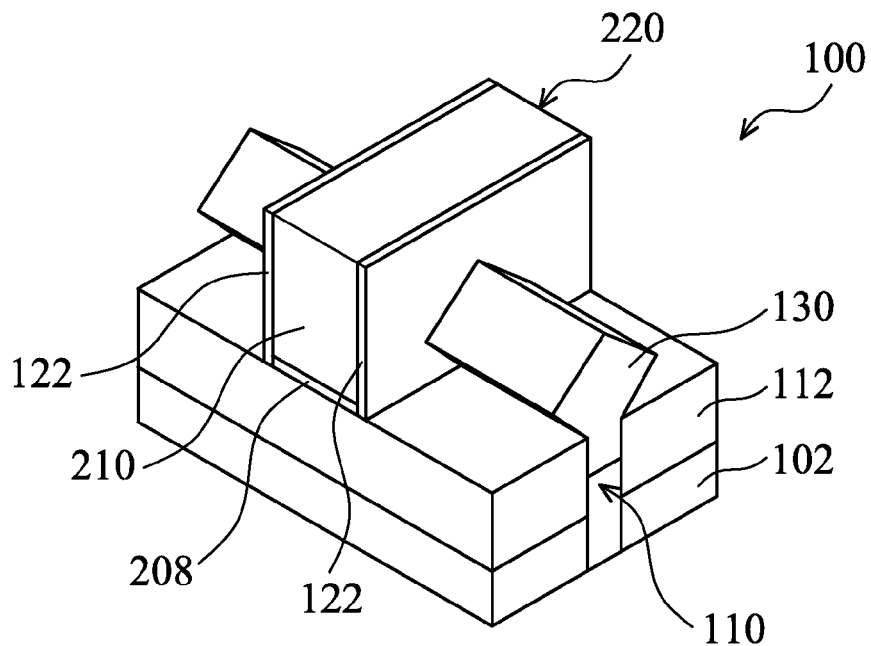

Afterwards, source/drain (S/D) structures 130 are formed in the recesses 111, as shown in FIG. 4C, in accordance with some embodiments. The S/D structures 130 extend from the recess 111 to above the isolation structure 112.

In some embodiments, S/D structures 130 are strained S/D structures. In some embodiments, the S/D structures 130 are formed by growing a strained material in recesses 124 of fin structure 110 by an epitaxial (epi) process. In addition, the lattice constant of the strained material may be different from the lattice constant of substrate 102.

In some embodiments, after S/D structures 130 are formed, a contact etch stop layer (CESL) (not shown) is formed to cover dummy gate structure 220 over the substrate 102. In some embodiments, the contact etch stop layer is made of silicon nitride, silicon oxynitride, and/or other applicable materials. The contact etch stop layer may be formed by plasma enhanced CVD, low pressure CVD, ALD, or other applicable processes.

Figure 4D:
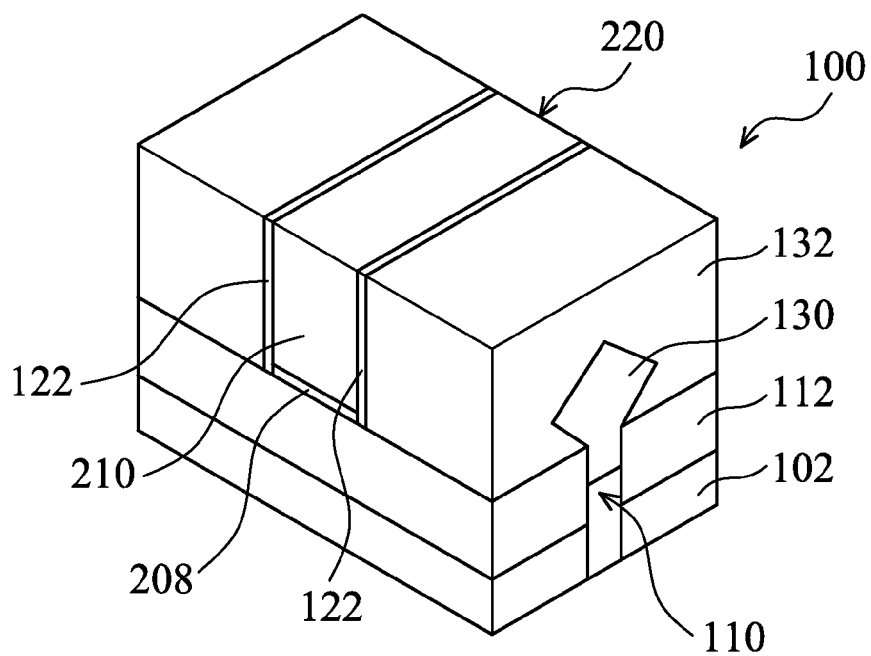

After the S/D structures 130 are formed, the ILD structure 132 is formed over the S/D structures 130 and the isolation structure 112 as shown in FIG. 4D, in accordance with some embodiments.

Figure 4E:
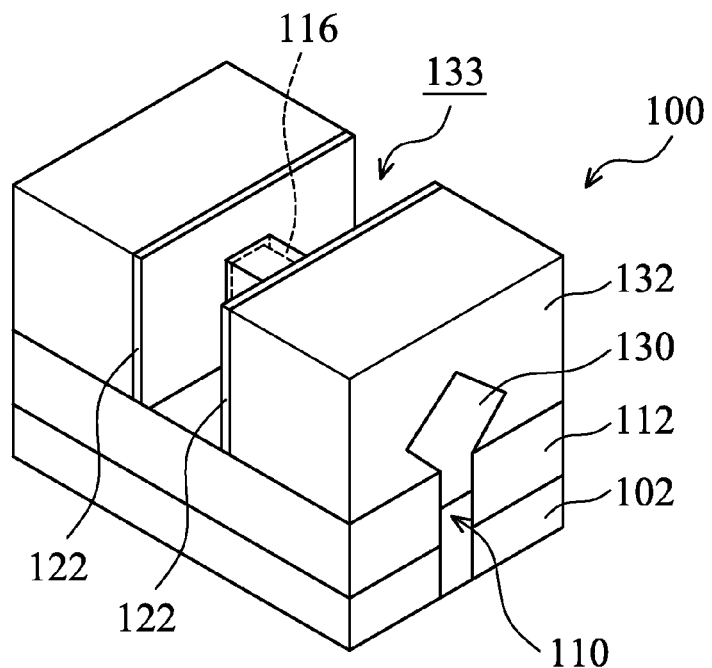

After the ILD structure 132 is formed, the dummy gate structure 220 is removed to form the trench 133 in the ILD structure 132 as shown in FIG. 4E, in accordance with some embodiments. It should be noted that the protection layer 116 over the middle portion of the fin structure 110 are remained and exposed.

Figure 4F:
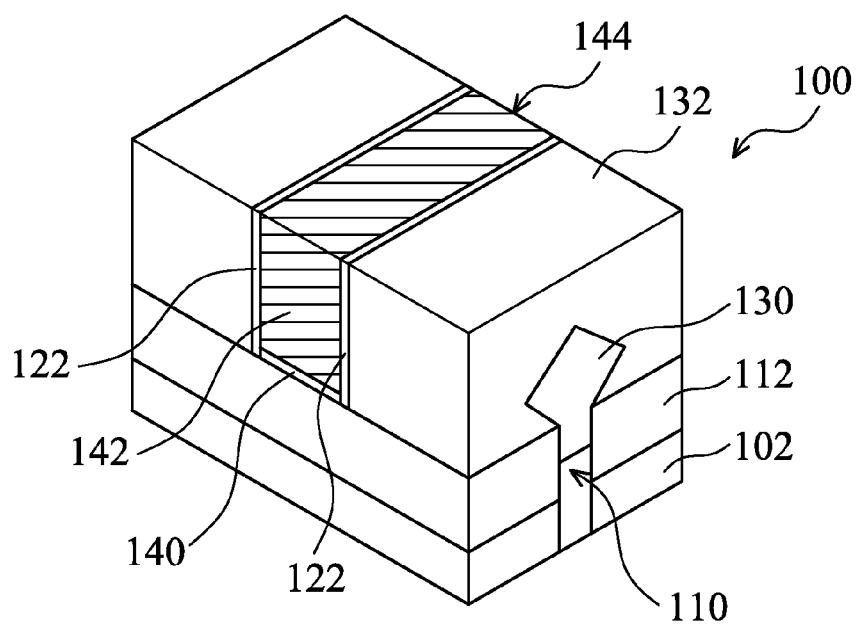

After the dummy gate structure 220 is removed, the gate dielectric layer 140 and the gate electrode layer 142 are filled into the trench 133 as shown in FIG. 4F, in accordance with some embodiments. Therefore, the gate structure 144 including the gate dielectric layer 140 and the gate electrode layer 142 is obtained.

Compared with FIG. 3F and FIG. 4F, the S/D structures 130 are directly formed on the top portion 110a of the fin structure 110 in FIG. 3F, but in FIG. 4F, the S/D structures 130 are formed in the recess 111 which is constructed by the isolation structure 112 and the bottom portion 110b of the fin structure 110.

Figure 5A:
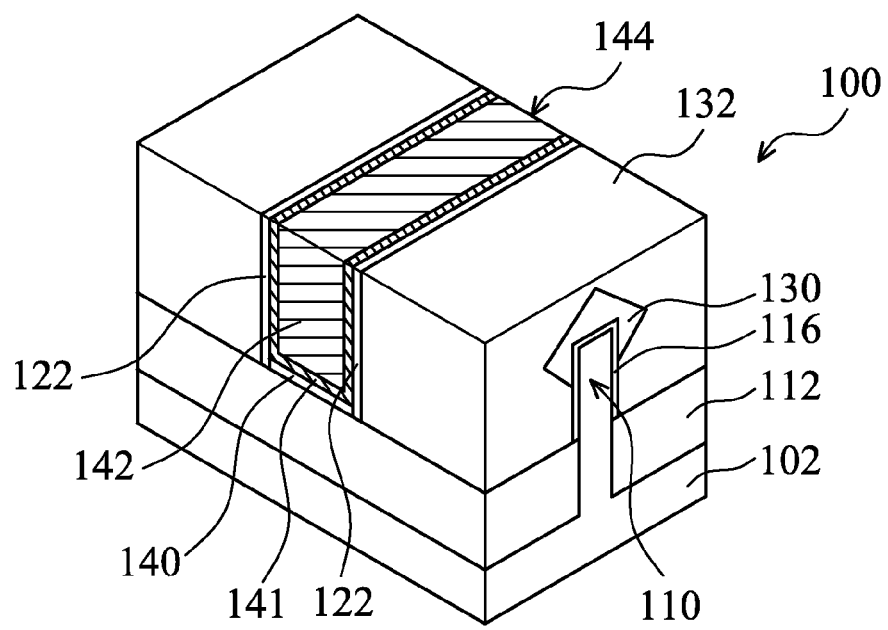
FIGS. 5A-5C show cross-sectional representations of a fin field effect transistor (FinFET) device structure, in accordance with some embodiments of the disclosure.
Figure 5B:
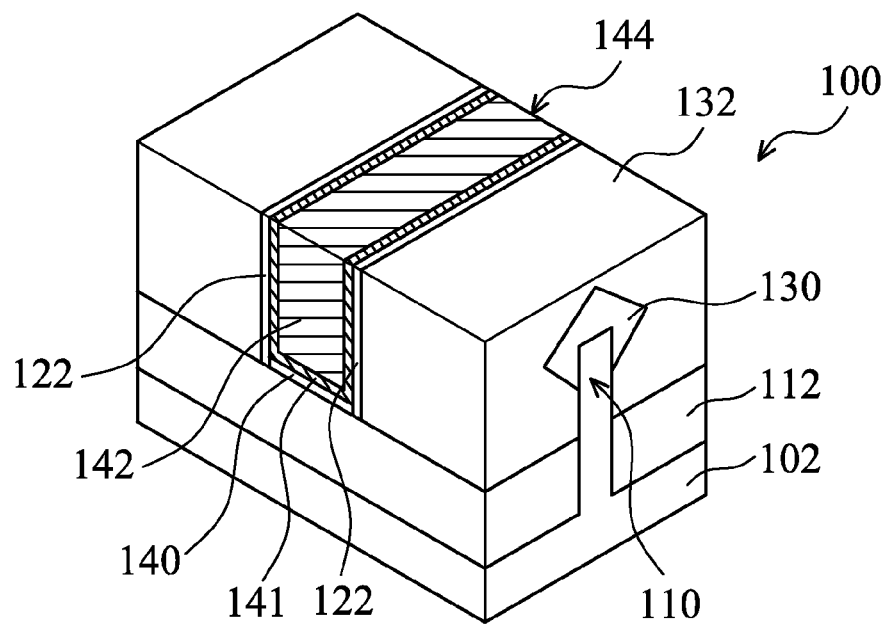
Figure 5C:
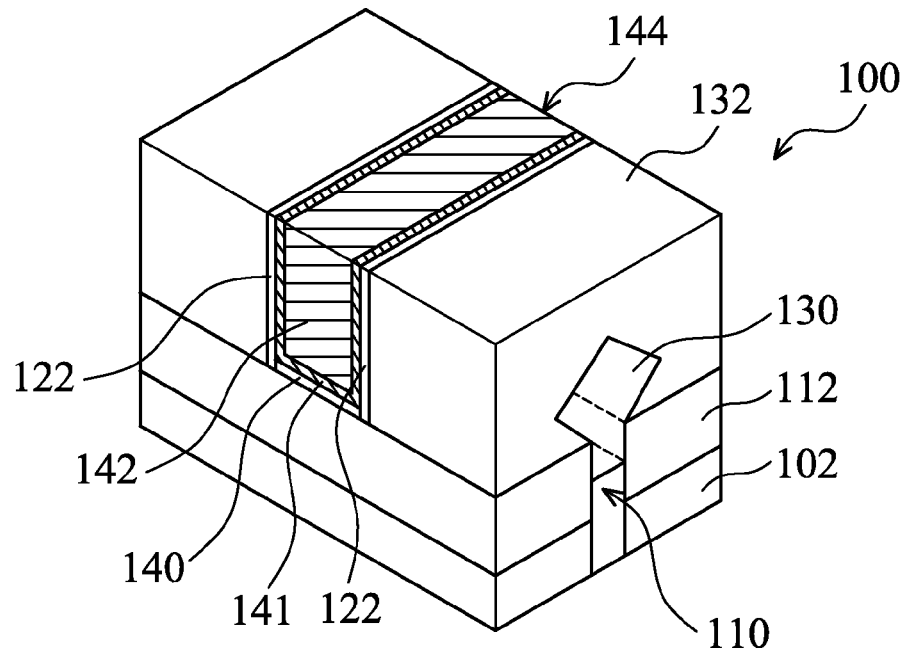

FIGS. 5A-5C show cross-sectional representations of a fin field effect transistor (FinFET) device structure, in accordance with some embodiments of the disclosure.

FIG. 5A is a modification embodiment of FIG. 1Q. As shown in FIG. 5A, the gate structure 144 is constructed by the gate dielectric layer 140, the work function layer 141 and the gate electrode layer 142. The work function layer 141 is between the gate dielectric layer 140 and the gate electrode layer 142.

The work function metal layer may be tuned to have a proper work function. For example, if a P-type work function metal (P-metal) for a PMOS device is desired, P-type work function materials may be used. Examples of P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials.

On the other hand, if an N-type work function metal (N-metal) for NMOS devices is desired, N-type metal materials may be used. Examples of N-type work function materials include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other applicable materials.

FIG. 5B is a modification embodiment of FIG. 3F. As shown in FIG. 5B, the work function layer 141 is between the gate dielectric layer 140 and the gate electrode layer 142, and the protection layer 116 underlying the S/D structure 130 are removed to facilitate the growth of the S/D structure 130.

FIG. 5C is a modification embodiment of FIG. 4F. As shown in FIG. 5C, the work function layer 141 is positioned between the gate dielectric layer 140 and the gate electrode layer 142.

Figure 6:
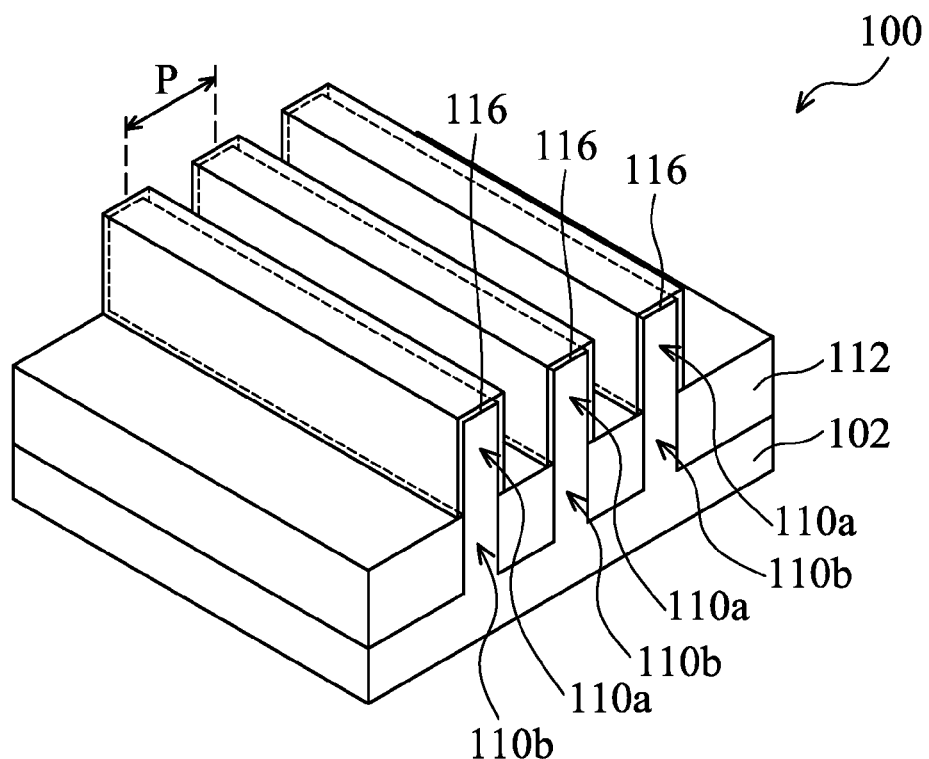
FIG. 6 show cross-sectional representations of a protection layer formed on the fin structures, in accordance with some embodiments of the disclosure.

FIG. 6 show cross-sectional representations of a protection layer formed on the fin structures, in accordance with some embodiments of the disclosure. A number of fin structures 110 are parallel to each other.

The number of the fin structures 110 is not limited to three, it can be adjusted according to actual application. A pitch P is defined between two adjacent fin structures 110. It should be noted that as mentioned above, if the thickness of the protection layer 116 is too great, the pitch P between two adjacent fin structures 110 is reduced. Therefore, the critical dimension (CD) is affected.

Embodiments for forming a fin field effect transistor (FinFET) device structure are provided. A fin structure is formed on a substrate, and an isolation structure is formed on the substrate. The fin structure has a top portion and a bottom portion, and the bottom portion of the fin structure is embedded in the fin structure. A protection layer is conformally formed on the top portion of the fin structure. The protection layer is used to protect the fin structure from being damaged by the fabrication processes and to repair the interface between the fin structure and the protection layer. The roughness of the interface is improved by forming the protection layer. Therefore, the performance of the FinFET device structure is improved.

In some embodiments, a fin field effect transistor (FinFET) device structure is provided. The FinFET device structure includes a substrate and a fin structure extending from the substrate. The FinFET device structure also includes an isolation structure formed on the substrate. The fin structure has a top portion and a bottom portion, and the bottom portion is embedded in the isolation structure. The FinFET device structure further includes a protection layer formed on the top portion of the fin structure. An interface is between the protection layer and the top portion of the fin structure, and the interface has a roughness in a range from about 0.1 nm to about 2.0 nm.

In some embodiments, a fin field effect transistor (FinFET) device structure is provided. The FinFET device structure includes a substrate and a fin structure formed on the substrate. The FinFET device structure also includes a gate structure formed on a middle portion of the fin structure. The gate structure comprises a high-k dielectric layer and a metal gate electrode layer formed on the high-k dielectric layer. The FinFET device structure further includes a protection layer formed between the fin structure and the high-k dielectric layer.

In some embodiments, a method for forming a fin field effect transistor (FinFET) device structure is provided. The method includes providing a substrate and forming a fin structure on the substrate. The method also includes forming an isolation structure on the substrate. The fin structure has a top portion and a bottom portion, the bottom portion is embedded in the isolation structure. The method includes forming a protection layer on the top portion of the fin structure. An interface is between the protection layer and the top portion of the fin structure, and the interface has a roughness in a range from about 0.1 nm to about 2.0 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
   a substrate;
   a fin structure extending from the substrate;
   an isolation structure formed on the substrate, wherein the fin structure has a top portion and a bottom portion, the bottom portion is embedded in the isolation structure;
   a protection layer formed on the top portion of the fin structure, wherein an interface is between the protection layer and the top portion of the fin structure, and the interface has a roughness in a range from about 0.1 nm to about 2.0 nm; and
   a source/drain (S/D) structure formed on and in direct contact with a portion of the protection layer, wherein a top surface of the S/D structure is higher than a top surface of the protection layer.

2. The fin field effect transistor (FinFET) device structure as claimed in claim 1, wherein the protection layer is made of silicon oxide, silicon oxynitride, silicon oxycarbide (SiOC) or combinations thereof.

3. The fin field effect transistor (FinFET) device structure as claimed in claim 1, further comprising:
   an inter-layer dielectric (ILD) structure formed on the isolation structure, wherein a portion of the protection layer is formed between the ILD structure and the fin structure.

4. The fin field effect transistor (FinFET) device structure as claimed in claim 1, further comprising:
   a gate structure formed on a middle portion of the fin structure, wherein the protection layer is formed between the fin structure and the gate structure.

5. The fin field effect transistor (FinFET) device structure as claimed in claim 4, wherein the middle portion of the fin structure is a channel region, and the channel region is wrapped by the protection layer.

6. The fin field effect transistor (FinFET) device structure as claimed in claim 4
   wherein the source/drain (S/D) structure adjacent to the gate structure, wherein the protection layer is formed between the S/D structure and the fin structure.

7. The fin field effect transistor (FinFET) device structure as claimed in claim 6, wherein the S/D structure comprises silicon germanium (SiGe), germanium (Ge), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof.

8. A fin field effect transistor (FinFET) device structure, comprising:
   a substrate;
   a fin structure formed on the substrate;
   a gate structure formed on a middle portion of the fin structure, wherein the gate structure comprises a high-k dielectric layer and a metal gate electrode layer formed on the high-k dielectric layer;
   a protection layer formed between the fin structure and the high-k dielectric layer; and
   a source/drain (S/D) structure formed on and in direct contact with a portion of the protection layer, wherein a top surface of the S/D structure is higher than a top surface of the protection layer.

9. The fin field effect transistor (FinFET) device structure as claimed in claim 8, wherein an interface is between the protection layer and the fin structure, and the interface has a roughness in a range from about 0.1 nm to about 2.0 nm.

10. The fin field effect transistor (FinFET) device structure as claimed in claim 8,
wherein the source/drain (S/D) structure adjacent to the gate structure, wherein the protection layer is formed between the S/D structure and the fin structure.

11. The fin field effect transistor (FinFET) device structure as claimed in claim 8, further comprising:
an inter-layer dielectric (ILD) structure formed on the fin structure, wherein a portion of the protection layer is formed between the ILD structure and the fin structure.

12. A method for forming a fin field effect transistor (FinFET) device structure, comprising:
providing a substrate;
forming a fin structure on the substrate;
forming an isolation structure on the substrate, wherein the fin structure has a top portion and a bottom portion, and the bottom portion is embedded in the isolation structure;
forming a protection layer on the top portion of the fin structure, wherein an interface is between the protection layer and the top portion of the fin structure, and the interface has a roughness in a range from about 0.1 nm to about 2.0 nm; and
fondling a source/drain (S/D) structure on and in direct contact with a portion of the protection layer, wherein a top surface of the S/D structure is higher than a top surface of the protection layer.

13. The method for forming the fin field effect transistor (FinFET) device structure as claimed in claim 12, further comprising:

before forming the isolation structure on the substrate, forming a dielectric layer on the fin structure and the substrate;
forming a sacrificial layer on the fin structure and the dielectric layer;
doping the fin structure;
removing the sacrificial layer; and
removing the top portion of the dielectric layer to expose the top portion of the fin structure.

14. The method for forming the fin field effect transistor (FinFET) device structure as claimed in claim 12, wherein forming the protection layer comprises using a microwave plasma process, a thermal oxidation process, a plasma-enhanced chemical vapor deposition process (PECVD) process, or atomic layer deposition (ALD) process.

15. The method for forming the fin field effect transistor (FinFET) device structure as claimed in claim 13, wherein defects or the dangling bonds in the top portion of the fin structure are repaired by the microwave plasma process.

16. The method for forming the fin field effect transistor (FinFET) device structure as claimed in claim 13, wherein the microwave plasma process is performed by using oxygen gas ($O_2$), hydrogen ($H_2$) gas or combinations thereof.

17. The method for forming the fin field effect transistor (FinFET) device structure as claimed in claim 13, wherein the microwave plasma process is performed at a temperature in a range from about 400 degrees to about 600 degrees.

18. The method for forming the fin field effect transistor (FinFET) device structure as claimed in claim 13, wherein the microwave plasma process is performed under a pressure in a range from about 0.1 torr to about 10 torr.

* * * * *